United States Patent [19]

Greaves et al.

[11] 4,091,340

[45] May 23, 1978

[54] OSCILLATOR CIRCUIT ARRANGEMENTS INCLUDING NULLATOR-NORATOR PAIRS

[75] Inventors: Alan John Greaves, Southall; Phillip Ernest Greenaway, Hatch End; John Mortimer Rollett, London, all of England

[73] Assignee: The Post Office, London, England

[21] Appl. No.: 694,293

[22] Filed: Jun. 9, 1976

Related U.S. Application Data

[60] Division of Ser. No. 554,592, Mar. 3, 1975, abandoned, which is a continuation of Ser. No. 299,931, Oct. 24, 1972, abandoned.

[30] Foreign Application Priority Data

Oct. 22, 1971 United Kingdom ............... 49264/71

[51] Int. Cl.² ............................................. H03B 5/26
[52] U.S. Cl. ............................... 331/132; 331/108 D; 331/140; 331/167; 333/80 R
[58] Field of Search ............... 331/108 R, 108 D, 115, 331/117 R, 132, 135, 167, 57, 138, 140; 333/80 R, 80 T

[56] References Cited

U.S. PATENT DOCUMENTS

| 3,539,943 | 11/1970 | Sheahan | 331/108 D |
| 3,562,678 | 2/1971 | Antoniou | 333/80 R |
| 3,573,647 | 4/1971 | Antoniou | 333/80 R X |

OTHER PUBLICATIONS

Davies, "The Significance of Nullators, Norators and Nullors in Active-Network Theory", The Radio and Electronic Engineeer, Nov. 1967, pp. 259–267.

Riordan, "Simulated Inductors Using Differential Amplifiers", Electronics Letters, Feb. 1967, vol. 3, No. 2, pp. 50–51.

*Primary Examiner*—Siegfried H. Grimm
*Attorney, Agent, or Firm*—Kemon & Estabrook

[57] ABSTRACT

The invention relates to electrical oscillators arranged to oscillate so as to produce a substantially sinusoidal output signal. The said oscillator includes a general impedance transvertor circuit arrangement having two differential amplifiers connected only to a plurality of resistive and capacitive impedance elements and arranged to simulate a tuned circuit with sufficient feedback to maintain oscillation within the tuned circuit. The transvertor circuit is an active device in the form of an impedance invertor circuit or a convertor circuit.

1 Claim, 76 Drawing Figures

GROUP 1  VARIATION 1  4 ALTERNATIVES

GROUP 1  VARIATION 2  4 ALTERNATIVES

GROUP 1  VARIATION 3  4 ALTERNATIVES

GROUP 2  VARIATION 1  4 ALTERNATIVES

GROUP 3    VARIATION 1    4 ALTERNATIVES

GROUP 3    VARIATION 2    4 ALTERNATIVES

GROUP 4    VARIATION 2    4 ALTERNATIVES

GROUP 4    VARIATION 3    4 ALTERNATIVES

GROUP 6    VARIATION 2    4 ALTERNATIVES

GROUP 6    VARIATION 3    4 ALTERNATIVES 4,091,340

OSCILLATOR CIRCUIT ARRANGEMENTS INCLUDING NULLATOR-NORATOR PAIRS

This is a division, of application Ser. No. 554,529, filed Mar. 3, 1975, now abandoned, and which is a continuation of Application Ser. No. 299,931 filed Oct. 24, 1972 and now abandoned.

The invention relates to an oscillator circuit arrangement. The circuit employs two differential input operational amplifiers and, with the addition of capacitors and resistors, simulates an impedance convertor or inverter circuit which, with the addition of further resistive or capacitive components, is made to oscillate. The circuit arrangement can be constructed using only resistors, capacitors and active devices and is particularly suitable for manufacture by modern micro-electronic techniques which provide an integrated circuit with passive components in thin or thick film form. Any inductive impedance which may be necessary to support oscillation is simulated using the resistors, capacitors and active devices, or alternatively the tuned circuit may be provided by a simulated $S^2$ or $1/s^2$ element and a resistor, (where "$s$" is the complex frequency variable).

Gyrator circuit arrangements using only active devices in combination with passive resistive or capacitive components are known from U.S. Pat. Nos. 3,562,678, and 3,573,647. The gyrators circuits described in the aforementioned patent specifications may be regarded as examples of a class of generalised impedance invertors and convertors. The invertor and convertor circuits to which the invention will be applicable will hereinafter be referred to as generalised impedance transvertor circuit arrangements, which may be abbreviated to transvertor circuit. A gyrator circuit is a transvertor circuit since it is an example of a generalised impedance invertor circuit, which is a two port with an input impedance $Z_n = f(s)Z_1$, where: $s$ is the complex frequency variable $Z_1$ is the load impedance.

For a gyrator, f(s) is a constant, and when the load is capacitive the input impedance is inductive. The gyrator circuits may be made to act as a tuned circuit by simulating an inductance coupled to a capacitor. To derive an oscillator from the tuned circuit it is necessary to provide a feedback signal with a sufficient loop gain to sustain oscillation. The feedback signal path may be inherent in the tuned circuit or, may be by way of a feedback coupling between a number of predetermined points in the tuned circuit network.

The present invention provides a number of oscillator circuit arrangements by determining the alternative feedback component connections which will produce and sustain oscillation in a transvertor circuit interconnected by a plurality of passive components. By employing two differential input operational amplifiers, and with the addition of a capacitor it is possible to simulate a low loss inductance. Connecting a second capacitor to this circuit provides a high Q resonant circuit which with suitable modifications can be made to oscillate at its natural frequency. The output frequency may be derived from the output terminal of either of the amplifiers, and since each amplifier has a low output impedance, power can be supplied to a range of loads with no significant change in waveform or frequency.

The term "selectable impedance tuning element", as used throughout the specification, is intended to distinguish the element as one in which the circuit designer may choose between a substantially resistive or substantially capacitive impedance element. Reference is also made in the specification to "earth", and it will be appreciated that this term is not intended to limit the invention but to indicate a reference potential.

The oscillators for the present invention form a closely related family. Each oscillator employs two differential input amplifiers, four resistors, two capacitors, and generally, a further resistor or capacitor to provide feed-back. Diodes may be added to this basic circuit to provide amplitude stabilisation for the output signal. In order to obtain sinusoidal oscillations non-linear elements may be added to the circuit which will prevent saturation of the operational amplifiers. According to the particular conditions operating within the circuit parallel back-to-back diodes or series back-to-back Zener diodes may be connected across one or both of the resonant circuit capacitors so as to limit the signal amplitude and to ensure a sinusoidal oscillation.

The differential amplifiers may be operational amplifiers. The resistors and capacitors may be discrete elements but are preferably formed in thin or thick film form on a single substrate.

The invention will now be described, by way of example, with reference to the accompanying diagrammatic drawings in which.

Figure 1:
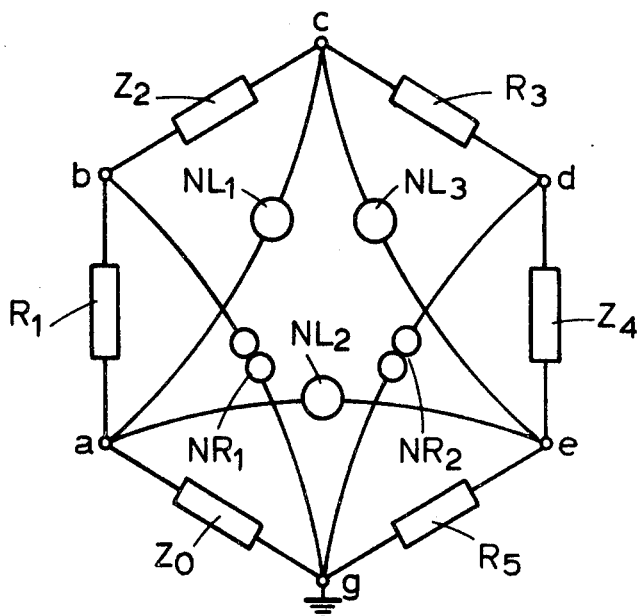
FIG. 1 illustrates the principle of the invention including nullator-norator pairs in a generalized circuit.

In the drawings each variation circuit in the GROUP is labelled VARIATION I, VARIATION II AND VARIATION III as appropriate.

Referring now to the drawings FIG. 1 illustrates a general resonant circuit according to the invention nullatornorator pairs which are generally termed 'nullors'. The circuit consists of node points $a,b,c,d,e$ and $g$, which are interconnected by impedances represented by $R_1$ between nodes $a$ and $b$, $Z_2$ between nodes $b$ and $c$, $R_3$ between nodes $c$ and $d$, $Z_4$ between nodes $d$ and $e$, $R_5$ between nodes $e$ and $g$, and $Z_0$ between nodes $g$ and $a$. Three nullators $NL_1$ $NL_2$ $NL_3$ are connected between the nodes $a,c$ and $e$. Two norators $NR_1$ and $NR_2$ are connected between the nodes $b$ and $d$ and ground (g). Any two of the three nullators NL may be formed by the input ports of a differential input amplifier (the third nullator is then redundant). The norators NR represent the output ports of the amplifiers. Two of the impedances $Z_0$ and $Z_2$, are capacitive and the third $Z_4$ is resistive. The impedances $R_1$, $R_3$, $R_5$, are all resistive. Since a nullator forces the nodes connected to it to assume the same potential, any two of the nullators $NL_1$ $NL_2$ and $NL_3$ may be assumed to be the differential inputs of an operational amplifier. Now, by considering the pairing of nullators with norators to form nullors, and then replacing the nullors with operational amplifiers it may be seen that the norator $NR_1$ may be paired with a nullator NL occupying any of the three positions between nodes a,c and e, and the norator $NR_2$ may be paired with one nullator NL occupying either of the two remaining positions, giving six possible nullor circuits hereinafter called a GROUP of circuits. Each nullor may be replaced by a differential input operational amplifier having a number of alternative configurations corresponding to the input polarities, so that each of the six nullor circuits can be realized in four different ways, each way being hereinafter called an ALTERNATIVE circuit.

It was found experimentally that only one of the four different ways of realising each nullor circuit gave a useful circuit thus there are six useful GROUPS of resonant circuit. These six basic circuits are shown in GROUPS 1 through 6. The amplifier interconnections which are avoided are for the inverting input of the second amplifier to node A, or, the inverting input of amplifier 1 by itself to node A; connecting the non-inverting input of the amplifier 1 to node B; connecting the non-inverting input of the amplifier 2, or the inverting of the amplifier 1 by itself, to node C. These undesirable interconnections gave rise to circuits which were latched-up or exhibited uncontrollable relaxation oscillations. In each of the six basic GROUP circuits it was found that capacitors could occupy two of the three positions represented by the impedances $Z_0$, $Z_2$, $Z_4$, giving eighteen variations of resonant circuit. To each of these eighteen variation resonant circuits suitable feedback components could be added in any of four different positions, giving seventy-two members of the family of oscillators. It was also found that oscillations occurred with no specific added feed-back element in three of the six basic circuits; these three circuits have the inverting input of the amplifier 1 connected to node c and the inverting input of the amplifier 2 connected to node e, so adding a further nine oscillators to the family of seventy-two. In the further nine oscillators it was found that oscillations were enhanced when specific feed-back elements were added. In U.S. Pat. No. 3,539,943 there is disclosed an oscillator circuit having a similar component configuration to one of the family of 81 specific oscillator circuits refered to above. This disclosed oscillator circuit is not illustrated in the accompanying drawings but forms the fourth ALTERNATIVE specific circuit of the third variation of circuits of the GROUP 2 circuits. However, the conception of a family of oscillators formed by variously interconnected and cross-coupled differential input amplifiers to form nullator-norator pairs according to this invention is not disclosed.

The position and type of feed-back element appropriate to any of the eighteen resonant variation circuits does not depend on the amplifier interconnections. A feedback component may be connected in any of the four positions, either between opposite pairs of nodes $a - d$, $b - e, c - g$, or across which ever of the impedances $Z_0$, $Z_2$, $Z_4$ is the resistor, and as such forms two loops of resistors and capacitors with those already in circuit. The type of feed-back element is such that both loops so formed contain an odd number of capacitors.

The family of oscillators will now be described in greater detail, considering each of the six basic GROUP circuits in turn.

Referring now to GROUP 1 and the the three variations each of whose specific four circuits are illustrated respectively in FIGS. 5 to 8, 9 to 12 and 13 to 16, the oscillator circuit arrangements include a first differential amplifier 1 and a second differential amplifier 2 each having an inverting and a non-inverting terminal and an output terminal. The output terminal from the amplifier 1 is connected to an output point 3, and the output terminal of the amplifier 2 is connected to an output point 4. The output point 3 is connected by way of a resistor 5 to the inverting input terminal of the amplifier 1 and the non-inverting input terminal of the amplifier 2. The output point 4 is connected by way of a resistor 6 to the inverting input terminal of the amplifier 2. A resistor 7 is connected between earth 8 and the non-inverting input terminal of the amplifier 1. The section of the circuit arrangement so far described is common to all the variation circuits. Three tuning elements may be added to the circuit arrangement so far described. These tuning elements consist of a capacitor 9, a capacitor 10, and a resistor 11. Each variation has a specific relative positioning of the two capacitors and the resistor and the four ALTERNATIVE circuit possibilities within this variation as shown in FIGS. 5 to 8, 9 to 12 and 13 to 16.

Variation 2 fully illustrated in FIGS. 9 to 12 for example, is a gyrator circuit which is made to simulate an inductance by coupling the capacitor 9 between the output point 4 and the noninverting input of the amplifier 1. A parallel tuned circuit is then formed by the capacitor 10 between earth and the common junction between the inverting input terminal of the amplifier 1 and the non-inverting input terminal of the amplifier 2. The positioning of the capacitors 9 and 10 therefore dictate that the resistor 11 is placed between the output point 3 and the inverting input terminal of the amplifier 2. This parallel tuned circuit may be caused to oscillate by means of a feedback signal derived by way of a resistor or a capacitor connected between predetermined junctions within the parallel tuned circuit arrangement.

Figure 9:
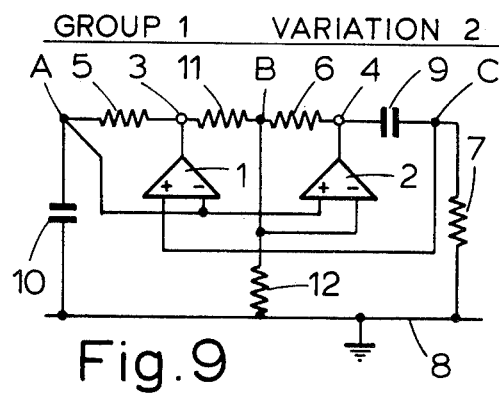
Figure 10:
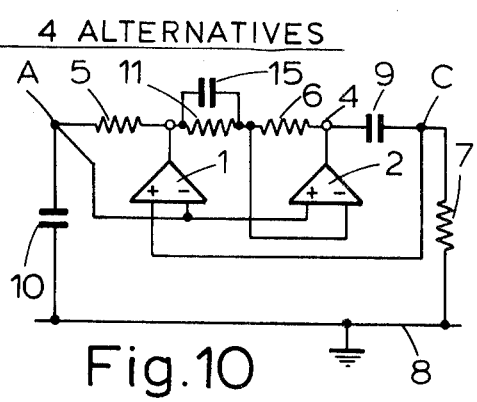
Figure 11:
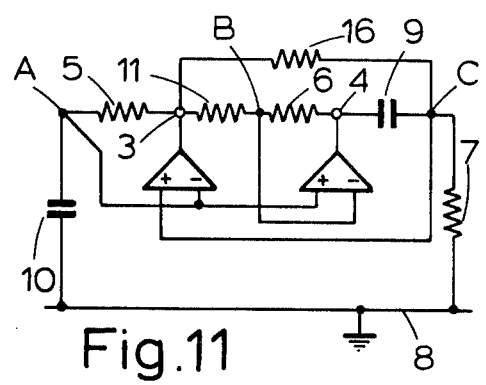
Figure 12:
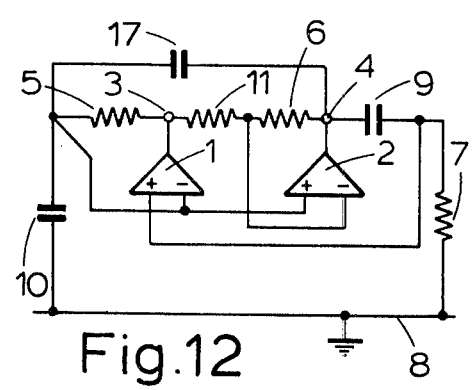
Figure 13:
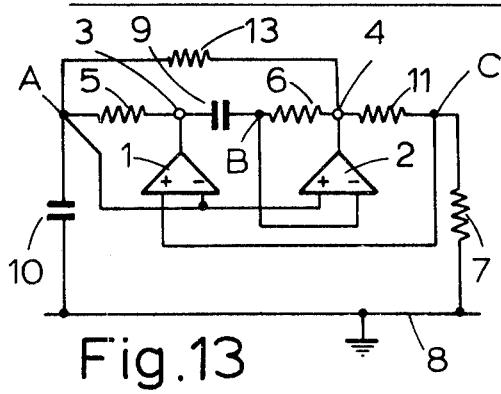
Figure 14:
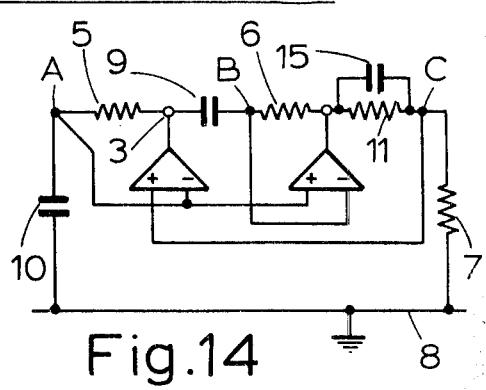
Figure 15:
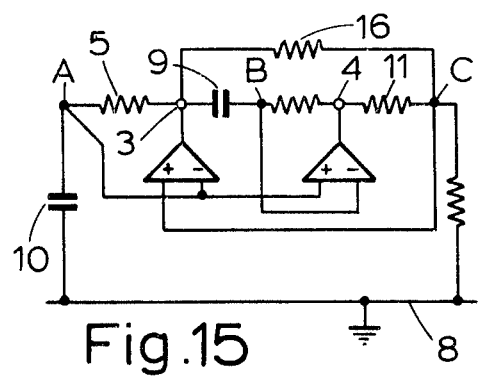
Figure 16:
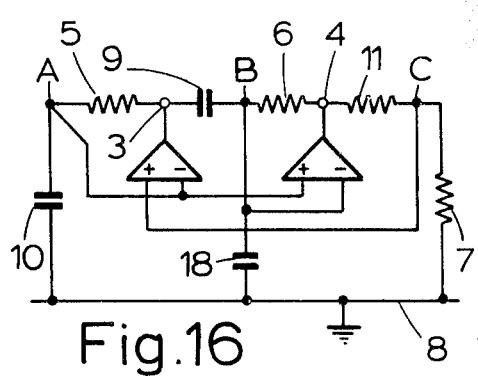
Figure 17:
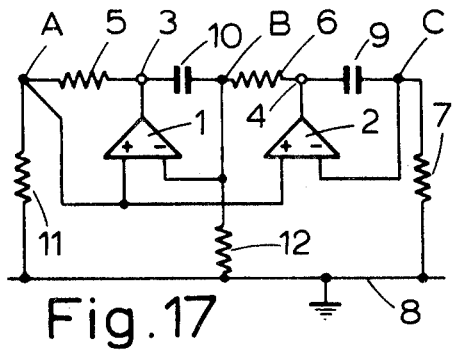
FIGS. 17 to 27 show a second group, GROUP 2 of 11 circuits in accordance with a second invention composed of three variations.
Figure 18:
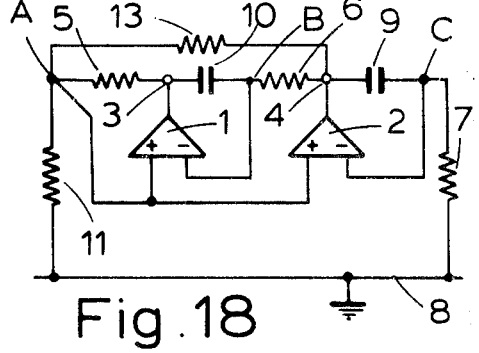
Figure 19:
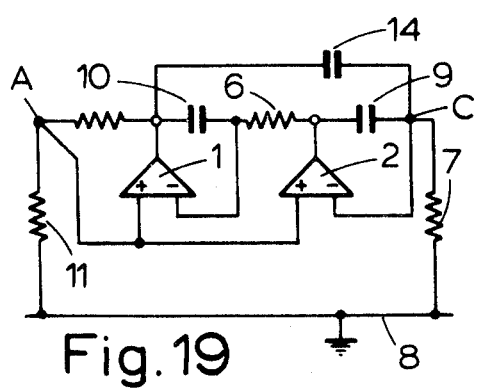
Figure 20:
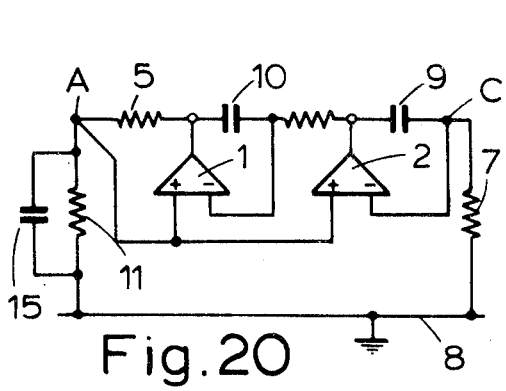
Figure 21:
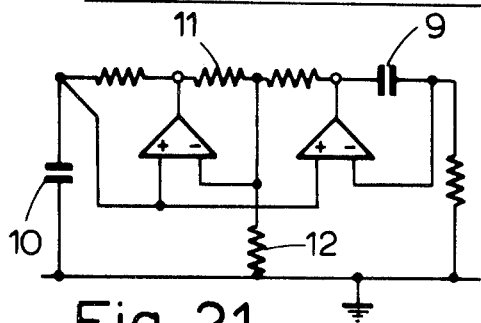
Figure 22:
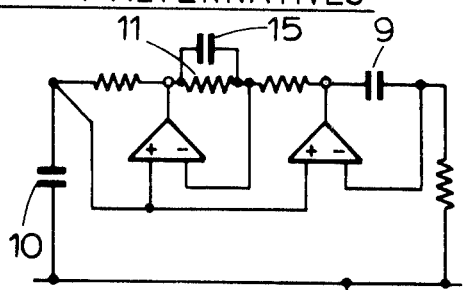
Figure 23:
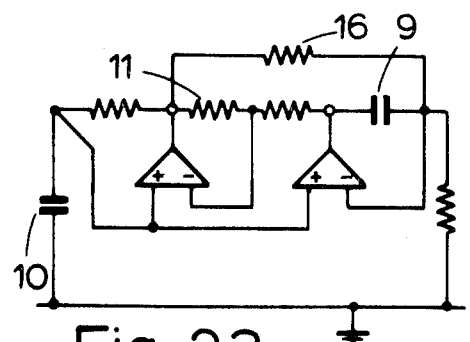
Figure 24:
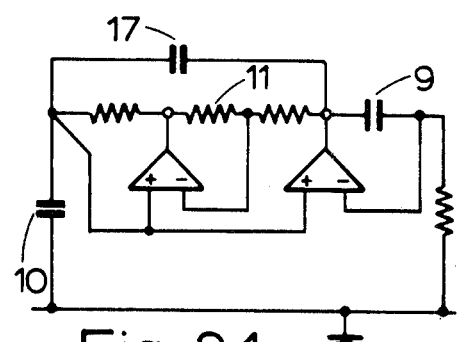
Figure 25:
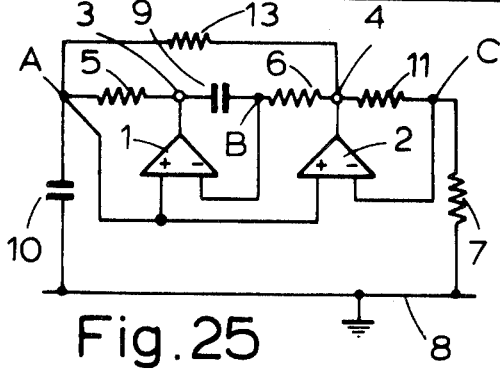
Figure 26:
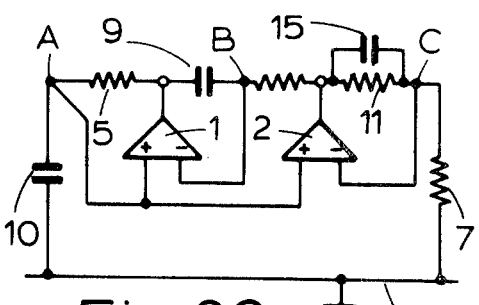
Figure 27:
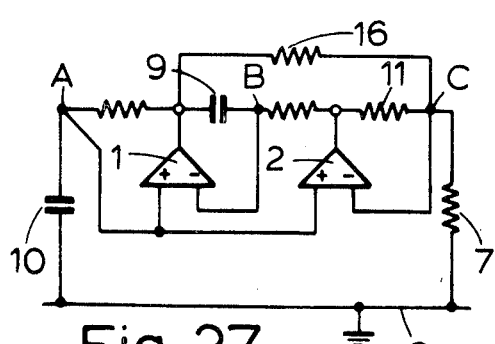
Figure 28:
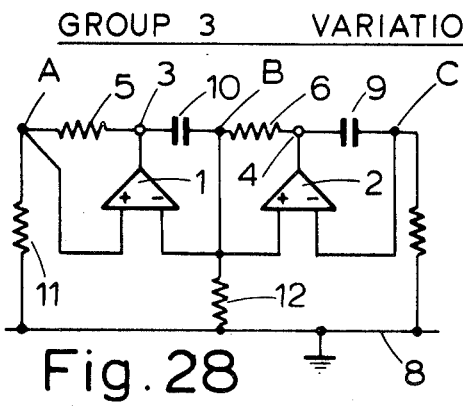
FIGS. 28 to 39 show a third group, GROUP 3 of 12 circuits in accordance with a third invention composed of three variations.
Figure 29:
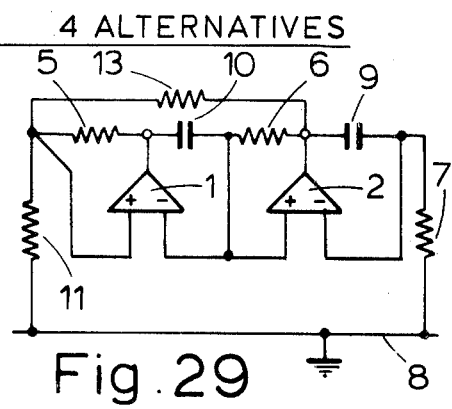
Figure 30:
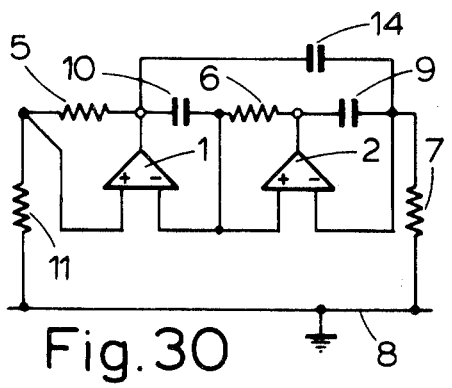
Figure 31:
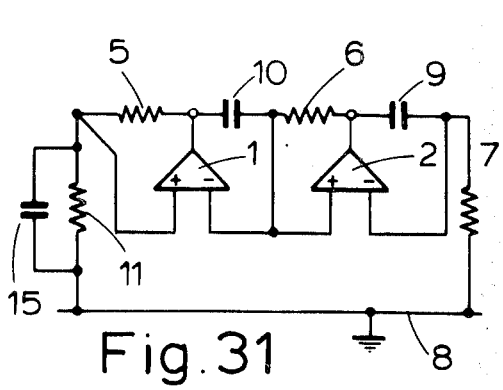
Figure 32:
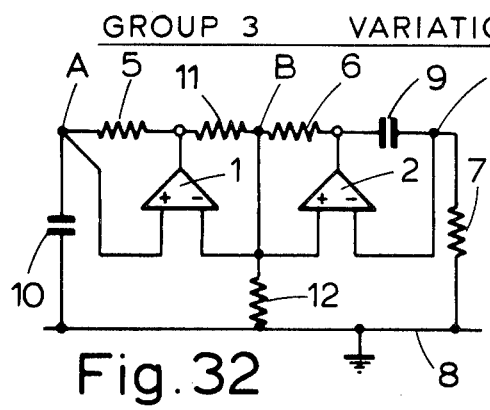
Figure 33:
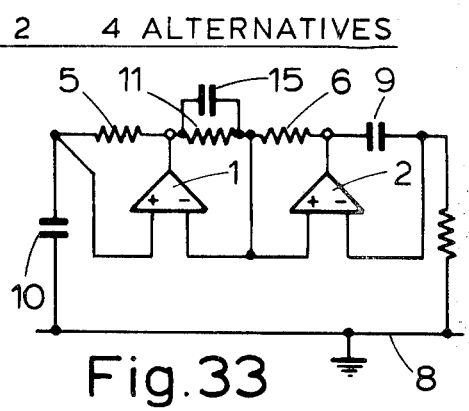
Figure 34:
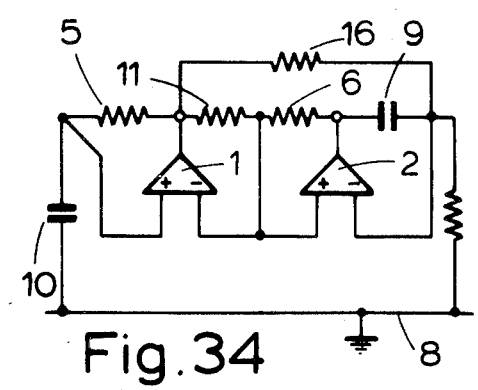
Figure 35:
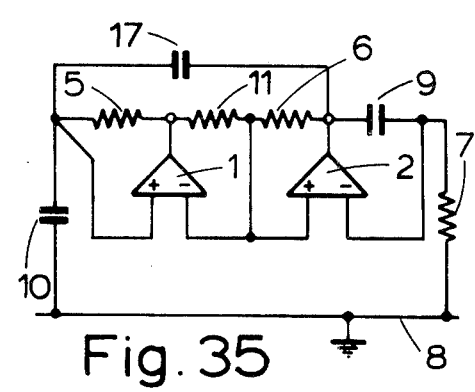
Figures 36, 37:
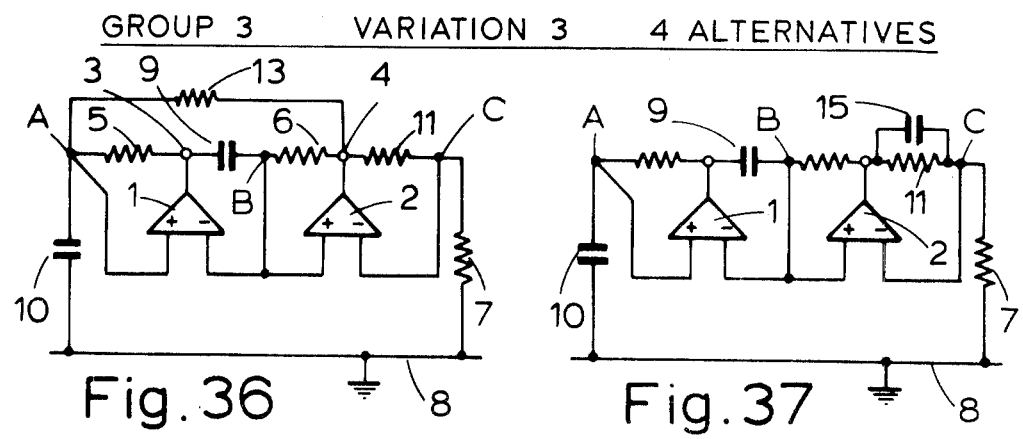
Figures 38, 39:
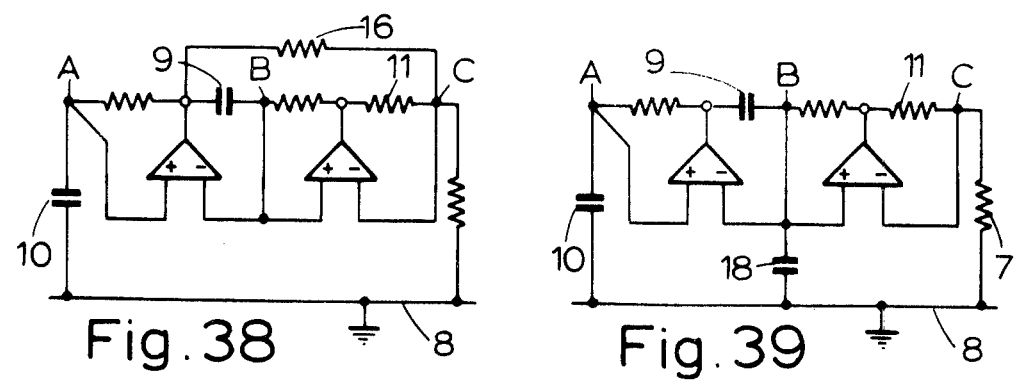
Figures 40, 41:
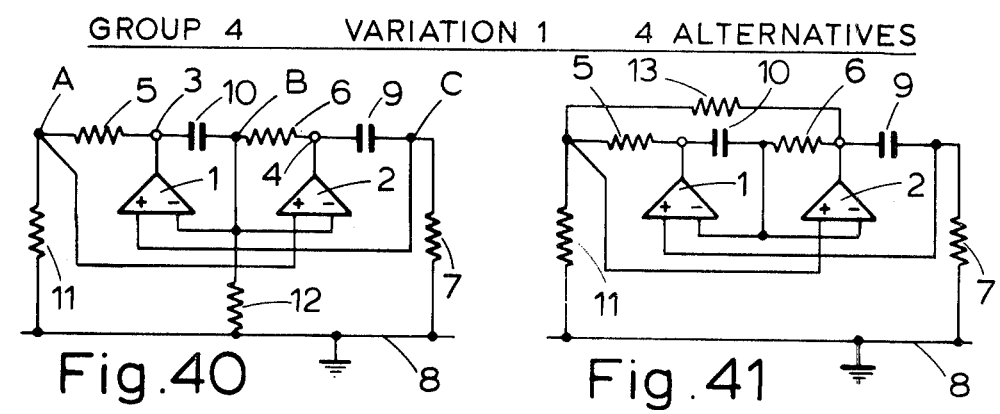
FIGS. 40 to 51 illustrate a fourth group, GROUP 4 of 12 circuits in accordance with a fourth invention composed of three variations.
Figures 42, 43:
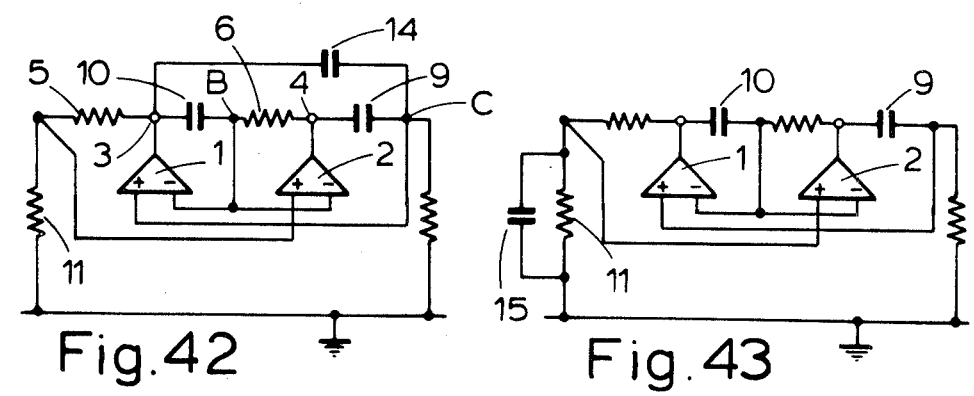

For each of the variation circuits there are two resistive impedance elements and 2 capacitive impedance elements which may be added to the parallel tuned LC circuit to cause oscillation to be maintained. Thus feedback elements for the circuits of variation 1 consist of a resistor 12 or a resistor 13 or a capacitor 14 or a capacitor 15. Continuing with the description of the circuits of variation 2, the circuit may be caused to oscillate by adding:

(i) the resistor 12 between earth 8 and the inverting input terminal of the amplifier 2 as shown in FIG. 9; or (ii) A resistor 16 between the output point 3 and the non-inverting input terminal of the amplifier 1 as shown in FIG. 11; or (iii) The capacitor 15 across the resistor 11 between the output point 3 and the inverting input terminal of the amplifier 2 as shown in FIG. 10; or (iv) A capacitor 17 between the output point 4 and the common junction between the inverting input terminal of the amplifier 1 and the non-inverting input terminal of the amplifier 2, as shown in FIG. 12.

The frequency of oscillation of the circuit arrangement with any of the feedback component elements connected in the circuit arrangement according to any of the four alternative circuits described above will be very nearly:

$$\frac{1}{2\pi}\sqrt{\frac{R_2}{C_0 R_1 R_3 C_4 R_5}} \quad (1)$$

Where:
$R_1$ is the resistive impedance of the resistor 5
$R_2$ is the resistive impedance of the resistor 11.
$R_3$ is the resistive impedance of the resistor 6.
$R_5$ is the resistive impedance of the resistor 7.
$C_0$ is the capacitance of the capacitor 10.
$C_4$ is the capacitance of the capacitor 9.

The frequency of oscillation does not vary significantly if the resistor or capacitor which is added to provide the feedback signal component has a large impedance compared with any of the impedances of resistors 5, 6, 7, 11 or capacitors 9, 10. The signal output from the oscillator circuit arrangement may conveniently be taken from between earth 8 and either of the output points 3 or 4, or from between output points 3 and 4.

So far as possible the reference numerals and terminology used to describe FIGS. 5–16 are retained in the illustration of each of the remaining five GROUPS of circuits which form the other workable differential amplifier input interconnections.

Figure 60:
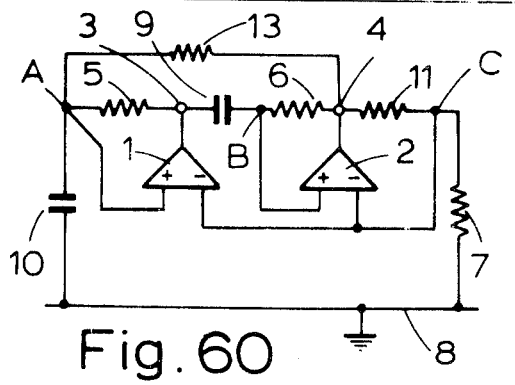
Figure 61:
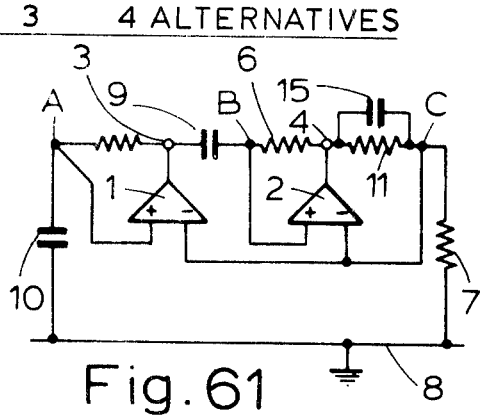
Figure 62:
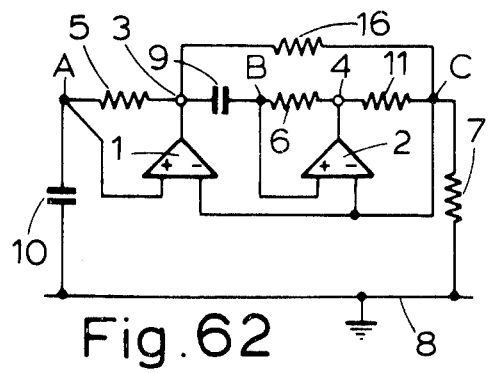
Figure 63:
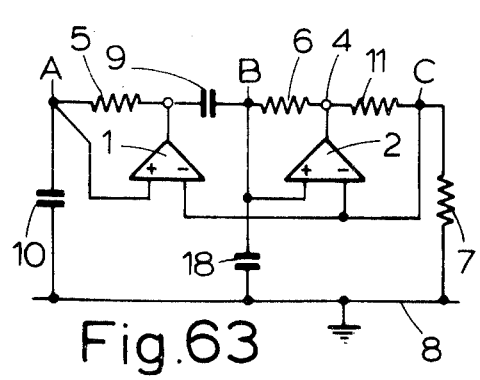
Figure 64:
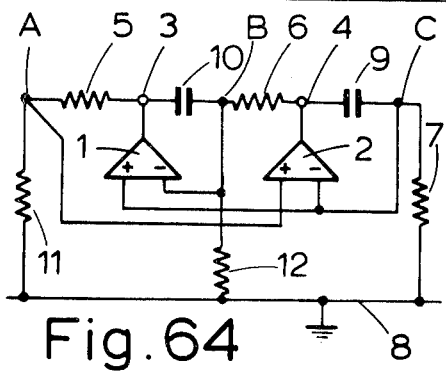
FIGS. 64 to 75 illustrate a sixth group, GROUP 6 of 12 circuits in accordance with a sixth invention composed of three variations.
Figure 65:
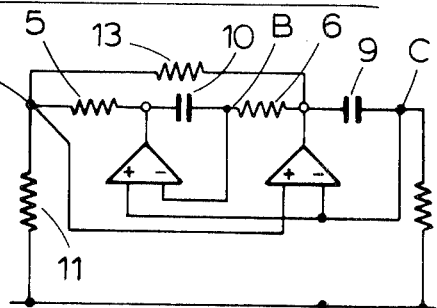
Figure 66:
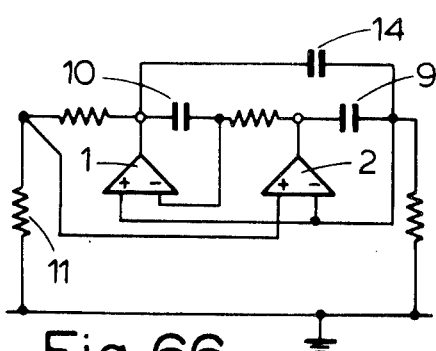
Figure 67:
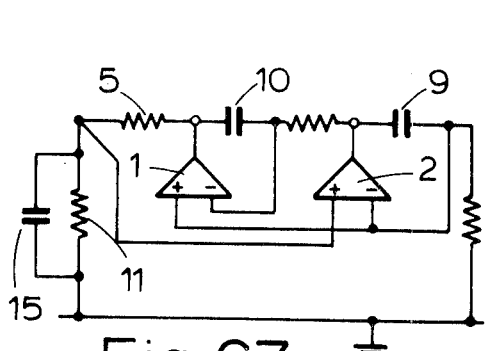
Figure 68:
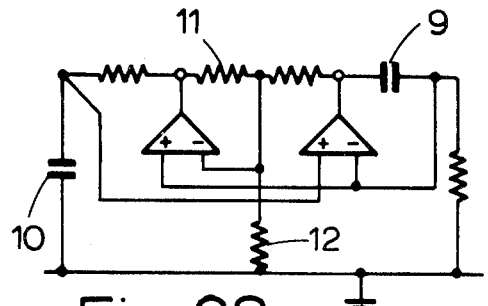
Figure 69:
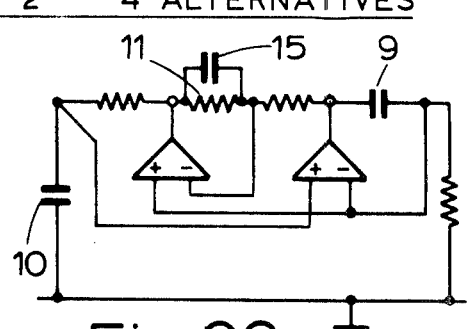
Figure 70:
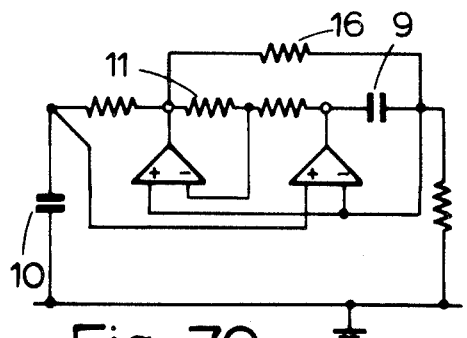
Figure 71:
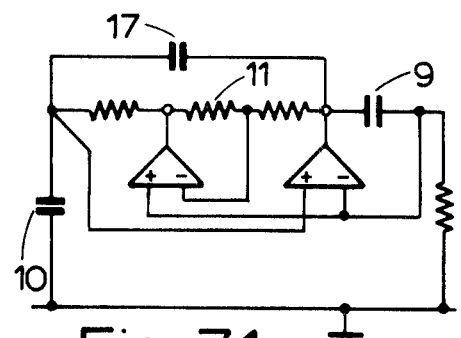
Figure 72:
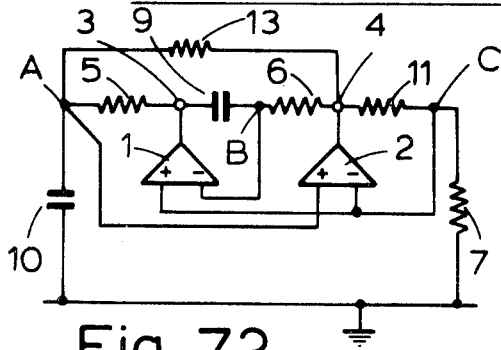
Figure 73:
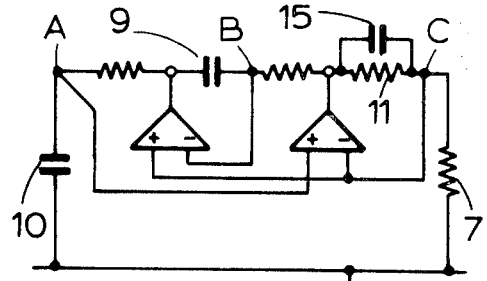
Figure 74:
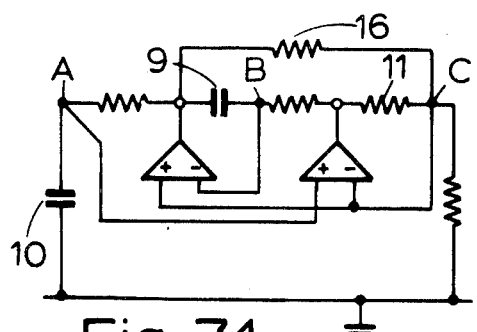

The common form between the family of oscillator circuits shown in the alternatives in each group will be apparent to those skilled in the art. It will be appreciated that the set of oscillator circuits contained within each group of circuits all have the same common connection between the amplifier input terminals. Within each group the alternative positions for the tuning circuit elements and the feedback elements will be seen to lie within a pattern which can be identified in terms of sets of components and loops within the circuit arrangement. Thus as shown in the four ALTERNATIVE circuits of FIGS. 60–63 labelled variation 3 the gyrator circuit is caused to simulate an inductance-capacitance tuned circuit by the capacitors 9 and 10 and to oscillate upon connection of any of the elements 13, 15, 16 or 18 in the positions illustrated. In all of the circuit arrangements it will be appreciated that the four loops described hereinafter each contain three elements of a first type and one element of a second type. The first type may be capacitive impedance and the second type resistive impedance or vice versa. Each loop includes at least one feedback element, at least one tuning element and at least one of the predetermined resistors of the gyrator circuit. Thus, the first loop from the point 3 is illustrated in FIG. 60 and includes the resistor 5, a junction A, a feedback resistor 13 to the point 4, and from the point 4 to a junction B by way of the resistor 6, and from junction B by way of a tuning element, (in this case the capacitor 9) to the output point 3. The second loop from the output point 3 as illustrated in FIG. 62 is by way of a feedback resistor 16 to a junction C, and from the junction C by way of a tuning element, (in this case the resistor 11) to the output point 4 and from the output point 4 by way of the resistor 6 to the junction B, and from the junction B by way of a tuning element, (in this case the capacitor 9) to the point 3. The third loop from the point 3 is illustrated in FIG. 63 by way of the resistor 5, junction A, tuning capacitor 10, to earth and from earth by way of a feedback element, (in this case the capacitor 18) to the junction B, and from the junction B by way of a tuning element, (in this case the capacitor 9) to the point 3 in the fourth loop in FIG. 61 there are 3 capacitors 10, 15 and 9 and resistor 11. Resistors 5, 6 and 7 are additional in this loop.

Figure 75:
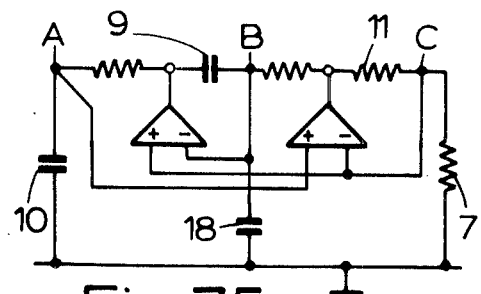

It will be seen that in the first loop in FIG. 60 there are three resistors 5, 13 and 6 and the capacitor 9. In the second loop in FIG. 62 there are three resistors 16, 11 and 6 and the capacitor 9. In the third loop in FIG. 63 there are three capacitors 10, 18 and 9 and the resistor 5. In the fourth loop in FIG. 61 there are three capacitors 10, 15 and 9 and resistor 11. It will be seen therefore that each of the four loops include elements of two types namely capacitor and resistors and that in each loop there are three elements of one type and a single element of the other type, i.e. three resistors and a capacitor or three capacitors and a resistor. By an inspection of the circuits shown in the corresponding Figures of other groups it will be seen that in all cases the four loops including the junctions A, B, and C, as described with reference to FIG. 75, all include the three elements of one type and one element of the other type and that each loop contains at least one tuning element, at least one feedback element and at least one resistor from the basic transverter circuit.

The principles used to design a suitable oscillator circuit according to the present invention will be described now with reference to the sixth group of oscillators illustrated in FIGS. 64–75. It will be appreciated that the tuning elements and feedback elements in the corresponding ALTERNATIVE circuits of the other 5 GROUPS of oscillator circuits are all identically positioned with respect to the output points 3 and 4, the terminals of the differential amplifiers, the junctions A, B, C and earth. In the first variation of the GROUP the first of the two capacitive tuning elements is located between the point 3 and junction B and the second capacitive tuning element is located between point 4 and junction C. The resistive tuning element is located between earth and junction A. To derive an oscillator circuit it is possible to include one of the feedback elements 12, 13, 14 or 15. The selection of capacitive or resistive feedback elements may be determined from the rules concerning the composition of the first, second, third and fourth loops and from the further rule that the resistive tuning element may be connected in parallel with a capacitive element forming the feedback element.

Figure 50:
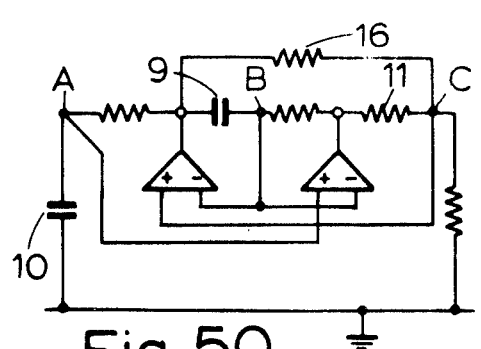
Figure 51:
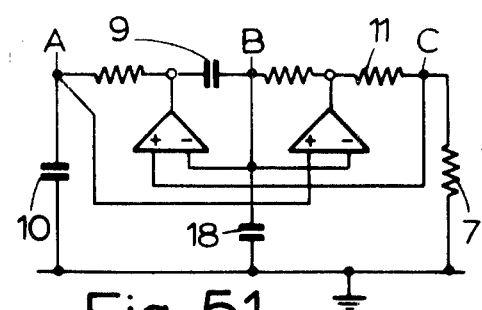
Figure 52:
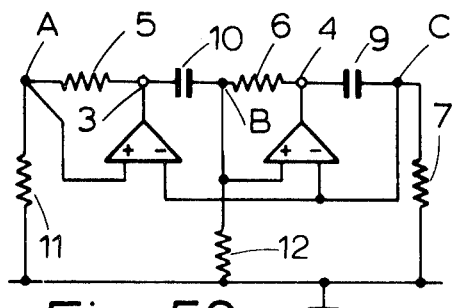
FIGS. 52 to 63 illustrate a fifth group, GROUP 5 of 12 circuits in accordance with a fifth invention composed of three variations.
Figure 53:
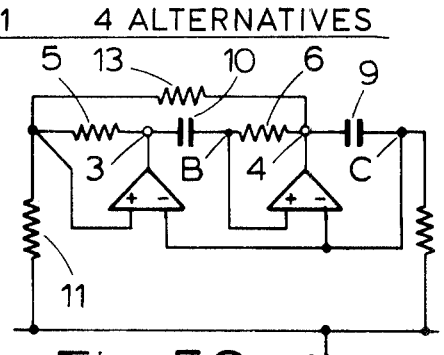
Figure 54:
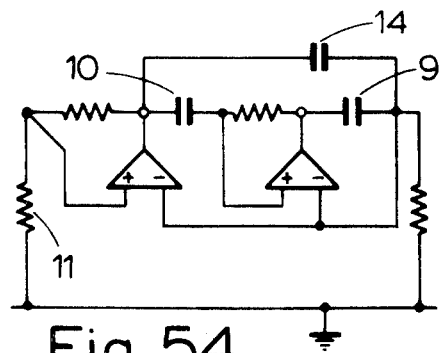
Figure 55:
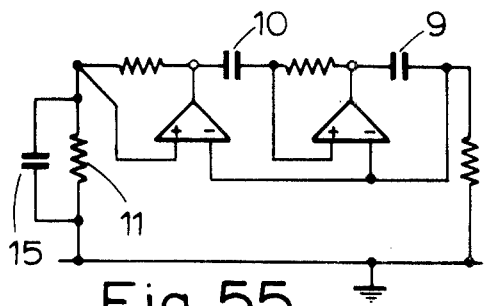
Figure 56:
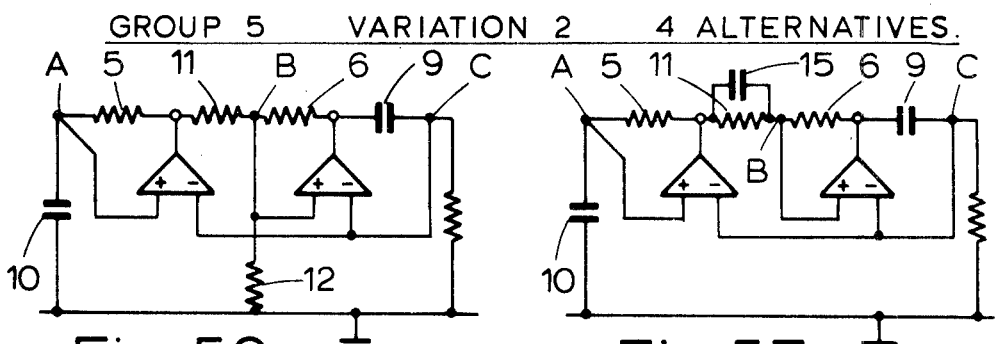
Figure 57:
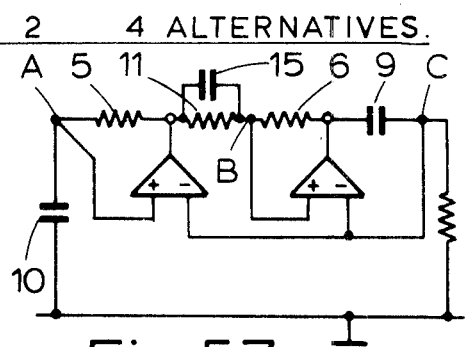
Figure 58:
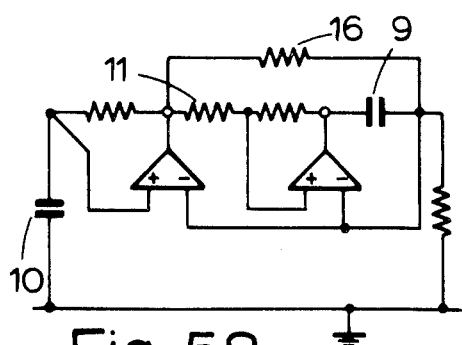
Figure 59:
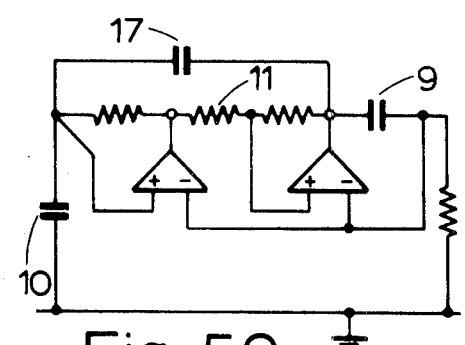
Figure 76:
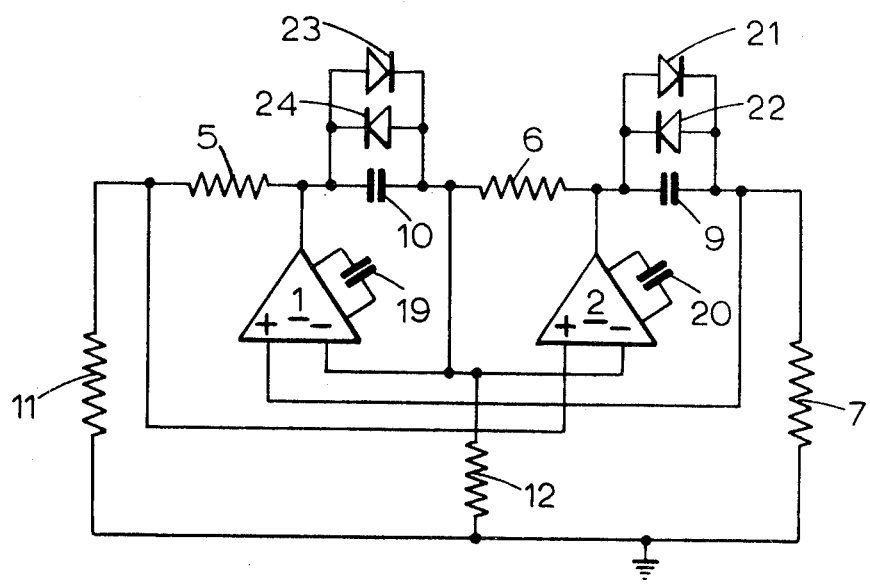
FIG. 76 shows a specific form of the circuit illustrated in FIG. 40 with the addition of signal amplitude limiting elements.

FIG. 76 illustrates a practical realization of one of the circuits illustrated generally by FIG. 50. For convenience, the components of the circuit of FIG. 76 have been given the reference numerals of corresponding components in the generalised description. Feed-back capacitors 19 and 20 have been added to the amplifiers 1 and 2 respectively. Parallel pairs of back-to-back diodes 21, 22 and 23, 24 have been added across the capacitors 9 and 10. If desirable, the pairs of diodes 21, 22 and 23, 24 may be replaced by back-to-back Zener diodes in series connected across the capacitors 9 and 10 in order to obtain sinusoidal oscillations. The diodes act as non-linear elements which prevent saturation of the operational amplifiers so limiting the signal amplitude and so ensuring sinusoidal oscillation. The gain-bandwidth product of the amplifiers 1 and 2 is restricted by the frequency compensation capacitors 19 and 20.

In a particular embodiment the circuits components and elements have the following values:

| | |
|---|---|
| Operational amplifier 1 | CV748 |
| Operational amplifier 2 | CV748 |
| Resistor 5 | 10 K ohms |
| Resistor 6 | 10 K ohms |
| Resistor 7 | 10 K ohms |
| Resistor 11 | 10 K ohms |
| Resistor 12 | 6.8M ohms |
| Capacitor 9 | 10nF |
| Capacitor 10 | 10nF |
| Capacitor 19 | 10pF |
| Capacitor 20 | 10pF |
| Diodes 21,22,23 and 24 | CV7642 |

The resistor 12 may lie between 100kohms to 10Mohms and it was found that with the resistor 12 set at 6.8Mohms the frequency of oscillation could be tuned continuously over 2 decades simply by varying resistor 7.

Figure 2:
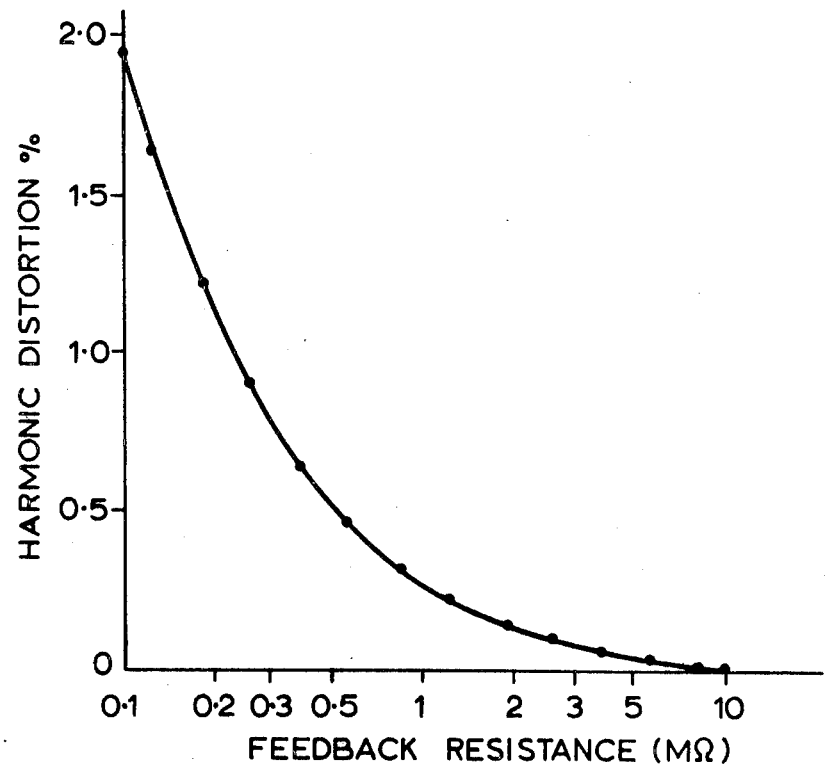
FIG. 2 shows graphically the relationship between percentage harmonic distortion and feedback resistance.
Figure 3:
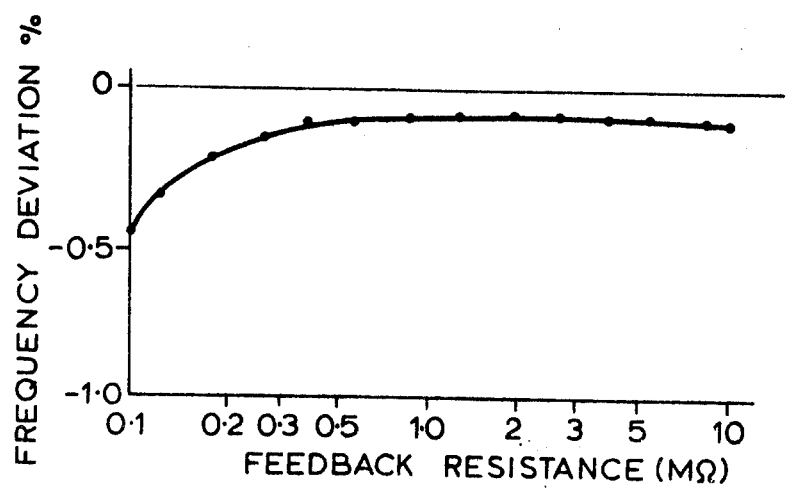
FIG. 3 shows graphically the relationship between percentage frequency deviation and feedback resistance.

The gain bandwidth of the oscillator shown in FIG. 76 was restricted to about 3MHz by means of the frequency compensation capacitors 19 and 20. The circuit was found to oscillate at 1588± 1Hz. After measuring the circuit component values to an accuracy of ±0.1% the theoretical oscillation frequency was calculated to be 1590± 5Hz. A test was conducted to see how the frequency and distortion of the resulting oscillation varied with the value of the feed-back resistance 12. The percentage frequency deviation and harmonic distortion were measured for values of feed-back resistor 12 between 100kohms and 10Mohms, beyond which it was found that oscillations ceased. FIGS. 2 and 3 show graphically the results of these measurements. The harmonic distortion defined as root-sum-of-squares of harmonic voltages divided by fundamental voltage, was found to be less than 0.1% for values of the resistor 12 from 3.2Mohms to 10Mohms. Over this range the frequency was observed to change by less than 0.02%. The frequency was found to be constant within 0.1% over a range of feed-back resistor 12 from 200kohms to 10Mohms. A further test showed that the frequency of oscillation varied by less than 15ppm/volts for amplifier power supply voltages between 6 and 20 volts.

Figure 4:
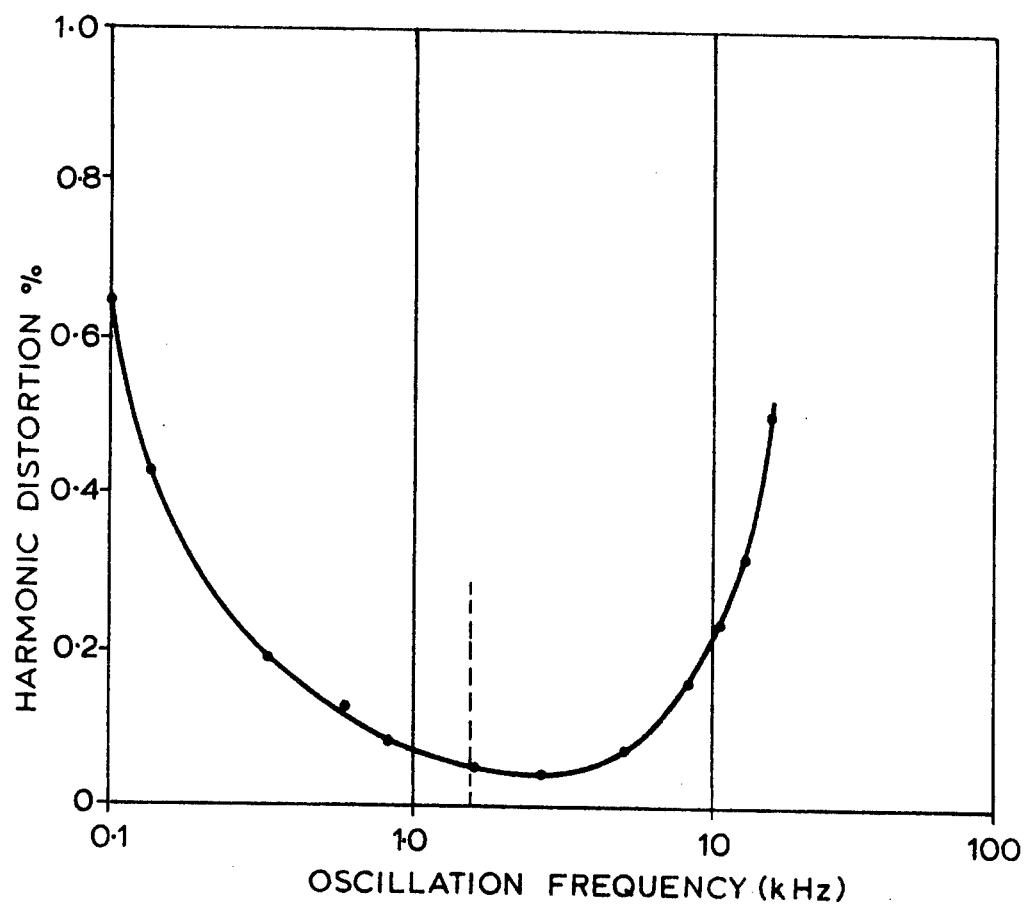
FIG. 4 shows graphically the relationship between percentage harmonic distortion and oscillation frequency.
Figure 5:
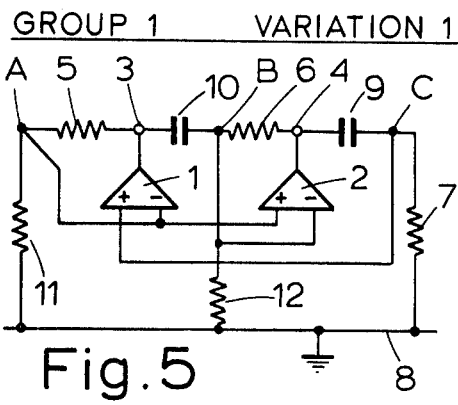
FIGS. 5 to 16 show a first group, GROUP 1 of 12 circuits in accordance with a first invention composed of three variations.
Figure 6:
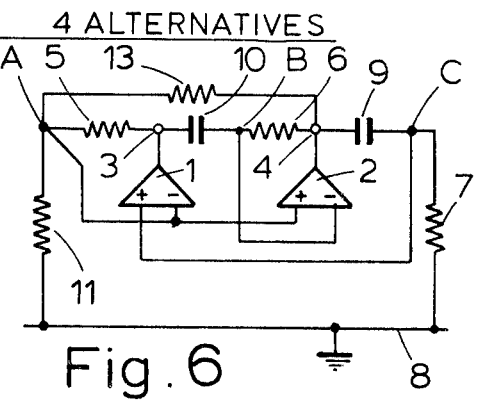
Figure 7:
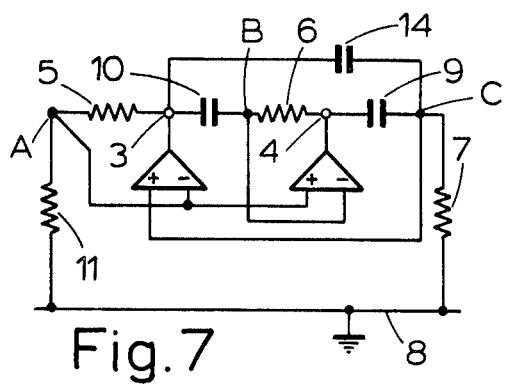
Figure 8:
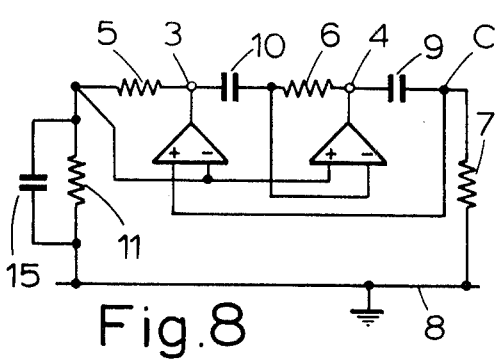
Figure 44:
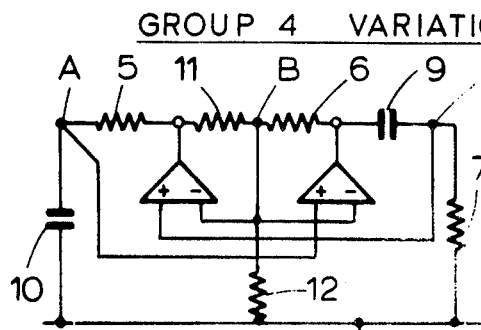
Figure 45:
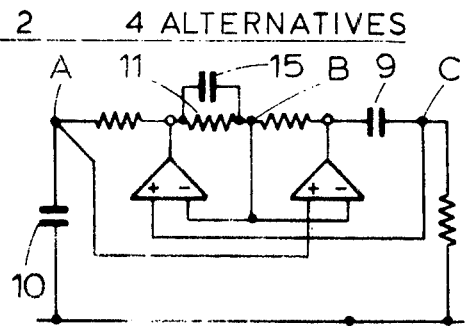
Figure 46:
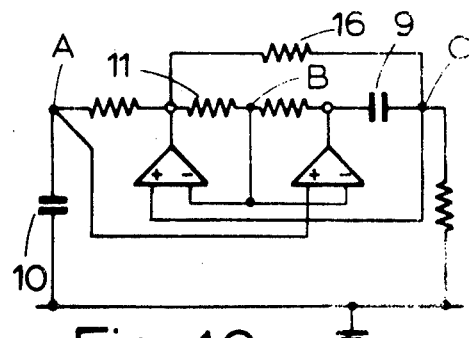
Figure 47:
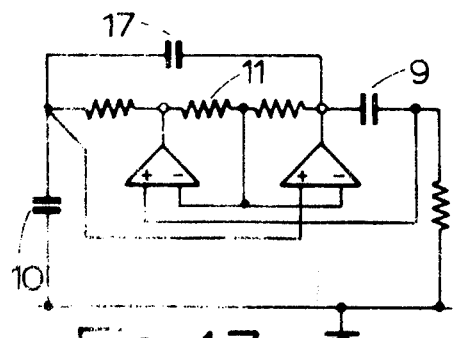
Figure 48:
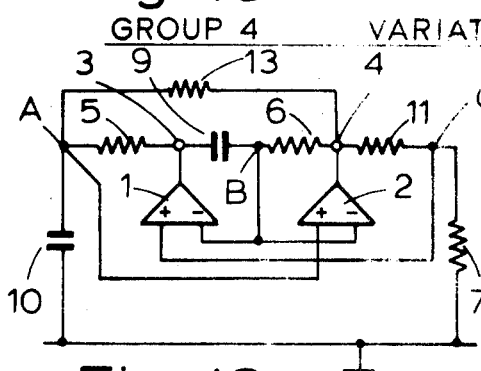
Figure 49:
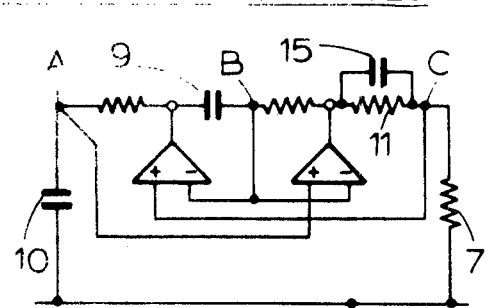

The resistor 12 when set at 6.8Mohms enabled the oscillator to be tuned over two decades with a harmonic distortion less than 0.4%, as shown graphically in FIG. 4. If the tuning range was restricted to one decade the distortion was found to be less than 0.12% Different frequency ranges were selected by changing the value of the capacitors 9 and 10: the distortion over any particular tuning range was found to be the least when both the capacitors were changed equally. Further frequency ranges were also selected by scaling the values of the resistors 5, 6, 7 and 11, by the same factor. By these methods the single oscillator circuit was made to oscillate sinusoidally from less than 0.1Hz to more than 100kHz. The effect of changing the power supply voltages was found to increase as frequency increased: the oscillation frequency altered by about 80ppm/volts at 10kHz and by about 800ppm/volts at 100kHz, for supply voltages between 6 and 20 volts. The highest frequency obtainable from the circuit shown in FIG. 44 depended upon the slewing rate and gain bandwidth product of the amplifiers. The lowest frequency was limited by the capacitor sizes and by the need to provide bias current to the amplifier via the circuit resistors. The use of resistors of large values in conjunction with FET-input operational amplifiers would enable the lower frequency limit, to be reduced substantially.

The oscillation frequency at the upper end of the frequency range is reduced from the expected value by the finite gain-bandwidth product of the operational amplifiers. With the type 748 operational amplifiers 1 and 2, the reduction in frequency can be made largely independent of temperature by the use of the frequency compensation capacitors 19 and 20 with suitable temperature coefficients. The temperature coefficient of frequency will then be, at most, half the sum of the temperature coefficients of the six passive elements in the circuit.

It was found that with some practical realisations of the circuits shown there was sufficient stray capacitance acting effectively as an added selectable component, or, due to the inherent phase-shift in practical amplifiers, or because of their finite bandwidth, the circuits illustrated as groups 2, 3 and 6, would oscillate with no additional physical feed-back element. It was found that care was required in the design and topography of the oscillator so as to limit the influence of stray capacitance and other effect inherent in any practical realisation of the circuit except, in those cases where the inherent effects produce a desirable and beneficial result in the operation of the oscillator, the beneficial signals produced by such effects are termed feedback signals.

We claim:

1. An oscillator circuit arrangement including two nullator-norator pairs, three resistive impedance elements and three selectable tuning elements arranged alternately in a ring to form a closed chain having six nodes, consisting of a first node, a second node, a third node, a fourth node, a fifth node and a sixth node, odd numbered nodes, one, three and five, being interconnected by two nullator means, and each of nodes two and four being connected to node six by a norator means and wherein two of said selectable tuning elements are capacitors and a third selectable tuning element is a resistive impedance element, in which the two nullator-norator pairs consist of a first and a second differential input operational amplifier, each having an inverting input, a non-inverting input and an output, and in which the non-inverting input of the second amplifier is connected to the first node; and output of the first amplifier is connected to the second node; the inverting input terminal of the first amplifier is connected to the third node; the output of the second amplifier is connected to the fourth node; the non-inverting input of the first amplifier and the inverting input of the second amplifier are directly connected together and are directly connected to the fifth node; and in which the first resistive impedance element is connected between the first and second nodes; the second resistive impedance element is connected between the third and fourth nodes; and the third resistive impedance element is connected between the fifth and sixth nodes; and in which a first of said selectable tuning elements is connected between the first and the sixth nodes; a second of said selectable tuning elements is connected between the second and third nodes; and a third of said selectable tuning elements is connected between the fourth and fifth nodes; the arrangement being such that two of said tuning elements are capacitances and the third tuning element is a resistance, and wherein a passive positive impedance element is connected to provide a feed-back signal to maintain stable oscillation within the circuit.

* * * * *